United States Patent [19]

Nakagawa

[11] Patent Number: 4,559,551
[45] Date of Patent: Dec. 17, 1985

[54] SEMICONDUCTOR DEVICE

[75] Inventor: Tsutomu Nakagawa, Hyogo, Japan

[73] Assignee: Mitsubishi Denki Kabushiki Kaisha, Tokyo, Japan

[21] Appl. No.: 651,138

[22] Filed: Sep. 17, 1984

Related U.S. Application Data

[63] Continuation of Ser. No. 334,336, Dec. 24, 1981.

[30] Foreign Application Priority Data

Dec. 25, 1980 [JP] Japan ............................ 55-188811

[51] Int. Cl.$^4$ ............................................ H01L 29/74
[52] U.S. Cl. ........................................ 357/38; 357/64
[58] Field of Search ................................. 357/38, 64

[56] References Cited

U.S. PATENT DOCUMENTS

| | | | |
|---|---|---|---|
| 3,943,549 | 3/1976 | Jaecklin et al. | 357/64 |
| 3,947,864 | 5/1976 | Yatsuo et al. | 357/64 |
| 3,988,772 | 10/1976 | Krishna | 357/64 |
| 4,021,837 | 5/1977 | Hutson | 357/64 |
| 4,177,477 | 12/1979 | Hokuyo et al. | 357/64 |
| 4,195,306 | 3/1980 | Füllman et al. | 357/38 |
| 4,214,254 | 7/1980 | Kimura et al. | 357/64 |
| 4,314,266 | 2/1982 | Temple | 357/38 |

Primary Examiner—Martin H. Edlow
Assistant Examiner—Jerome Jackson
Attorney, Agent, or Firm—Sughrue, Mion, Zinn, Macpeak & Seas

[57] ABSTRACT

The semiconductor device has a first emitter layer and an auxiliary first emitter layer each having a first electrical conductivity, a first base layer having a second electrical conductivity, a second base layer having said first electrical conductivity and a second emitter layer having said second electrical conductivity. The layers are formed in the stated order from one main surface of the semiconductor to the other with the first base layer being partially exposed in the region of the auxiliary first emitter layer on said one main surface to form a gate region. A heavy metal impurity such as gold or platinum whose density is higher than the impurity density determining the electrical conductivity of said second base layer is selectively diffused in a particular region which extends through said gate region to make the specific resistance of said second base layer inside said particular region higher than the specific resistance of said second base layer outside said particular region.

3 Claims, 10 Drawing Figures

SEMICONDUCTOR DEVICE

This is a continuation of application Ser. No. 334,336, filed Dec. 24, 1981.

BACKGROUND OF THE INVENTION

The present invention relates to the structure of a semiconductor device and more particularly to the structure of a thyristor.

The withstand voltage of a semiconductor element such as a thyristor having at least one p-n junction is determined from the specific resistance of its high resistance layer. In general, the specific resistance of a semiconductor substrate, from which a semiconductor element is manufactured, is variable inside the semiconductor substrate because of various factors involved in the manufacturing process. Therefore, avalanche breakdown occurs in a small region which is lowest in specific resistance. Accordingly, if a pulsive overvoltage is applied, the small region generates heat which may damage the semiconductor element. Heretofore, in a circuit having a semiconductor element, a ZNR (zinc oxide non-linear resistor) or an avalanche diode was connected in parallel to the semiconductor element, in order to protect the semiconductor element from the overvoltage. For instance, in a high voltage thyristor valve having several hundreds of thyristors connected in series, voltage dividing resistors or anode firing avalanche diodes were connected thereto in order to protect the thyristor valve from a pulsive overvoltage. Thus, the method was disadvantageous in that an intricate protective circuit was required and the device was liable to become bulky.

SUMMARY OF THE INVENTION

In order to eliminate the above-described difficulties, the present invention provides a semiconductor element whose structure is so designed as to have a function to protect the element from a pulsive overvoltage. The specific feature of the invention resides in that a heavy metal such as platinum or gold, which provides a deep impurity level in a semiconductor substrate, is diffused in a gate region, so that the specific resistance (adapted to block an applied voltage) of a second base layer inside the portion where the heavy metal has been diffused is higher than that of the second base layer outside the portion.

The foregoing and other objects, features and advantages of the invention will be apparent from the following more particular description of preferred embodiments of the invention as illustrated in the accompanying drawings.

DETAILED DESCRIPTION OF THE INVENTION

Figure 1:
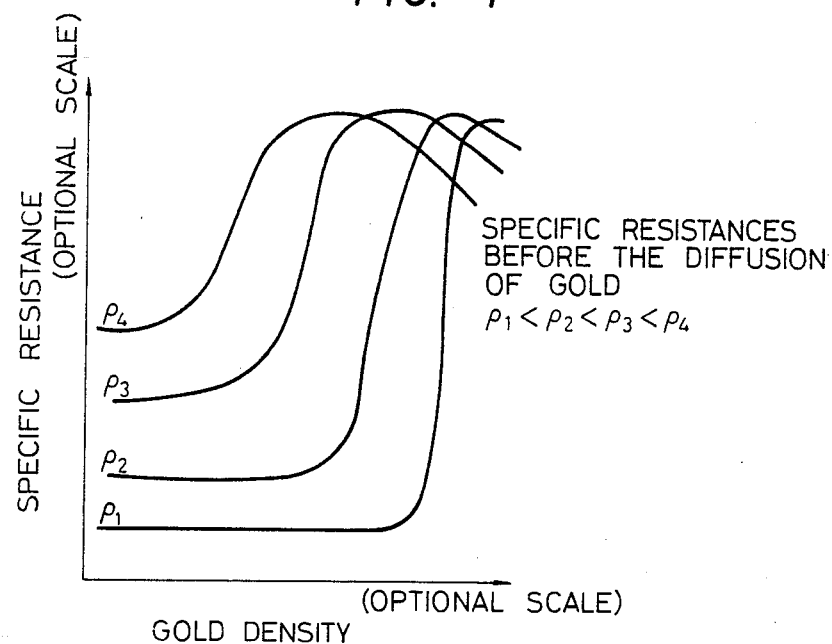
FIG. 1 is an explanatory diagram showing gold density with specific resistance.

FIG. 1 shows the relationships between gold densities and specific resistances ($\rho$) in the case where gold is diffused in an n-type silicon. In this case, the following relation is held:

$$\rho = \frac{1}{qn\mu} = \frac{N_D - N_A}{q\mu(N_{Au} - N_D - N_A)} g_A N_C \exp\frac{E_C - E_A}{kT}$$

where q is the quantity of electrical, n is the number of electrons, $\mu$ is the mobility, $N_{Au}$ is the gold density; $N_D$ is the number of donors, $N_A$ is the number of acceptors, gA is the acceptor level conversion efficiency, K is Boltzmann constant, T is the absolute temperature, $N_C$ it the conduction band effective density, $E_C$ is the conduction band energy level, and $E_A$ is the noble metal energy level in Si.

As is apparent from FIG. 1, the specific resistance of a semiconductor substrate is changed by gold diffusion and upon application of a voltage the depletion layer width is increased in proportion to the specific resistance of the base layer.

Figure 2:
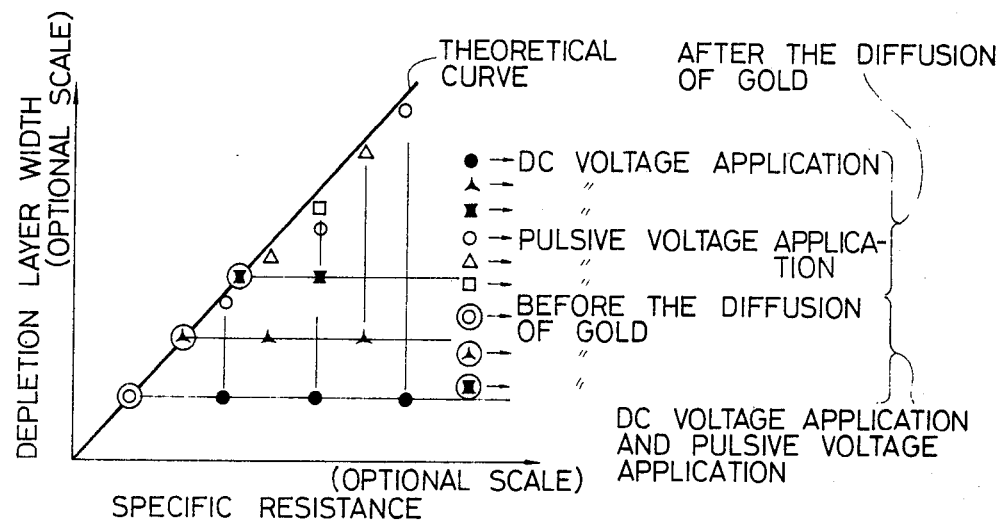
FIG. 2 is an explanatory diagram indicating specific resistances with depletion layer widths before and after the diffusion of gold.

FIG. 2 shows measurements of the depletion layer widths of three p-n junction diodes different in specific resistance with a DC voltage and a pulsive voltage applied, which are diffused with different quantities of gold, and measurements of the depletion layer widths before the diffusion of gold. As is apparent from FIG. 2, when measured with the DC voltage, the depletion layer width is maintained unchanged before and after the diffusion of gold; however, when measured with the pulsive voltage, the depletion layer width can be substantially theoretically obtained from the increased specific resistance.

That is, the specific feature of the invention is that these facts are utilized to protect a semiconductor element from a pulsive overvoltage.

The present invention will be described in detail with reference to the case where the technical concept of the invention is applied to a thyristor.

Figure 3:
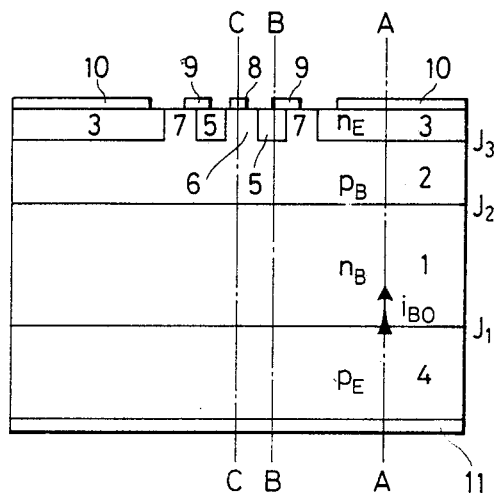
FIG. 3 is a sectional view of a conventional amplification gate type thyristor.

FIG. 3 shows a so-called "amplification gate type thyristor". The thyristor is formed as follows: First, an auxiliary thyristor part is formed, which comprises: an auxiliary first emitter layer 5 having a first electrical conductivity, a first base layer 2 having a second electrical conductivity, a second base layer 1 having the first electrical conductivity and a second emitter layer 4 having the second electrical conductivity which are formed in the stated order from one main surface of a semiconductor substrate to the other main surface; and a surface exposed region 6 serving as the gate of the first base layer 2. A main thyristor part is formed, which comprises: a first emitter layer 3 replacing the auxiliary first emitter layer 5; a surface exposed region 7 serving as the gate of the first base layer 2; and the layers which are in common with the auxiliary thyristor part. Then, a gate electrode 8 is formed on the region 6, an auxiliary electrode 9 is formed over the auxiliary first emitter layer 5 and the region 7, and a cathode electrode 10 and an anode electrode 11 are formed on the first emitter layer 3 and the second emitter layer 4, respectively.

Figure 4:
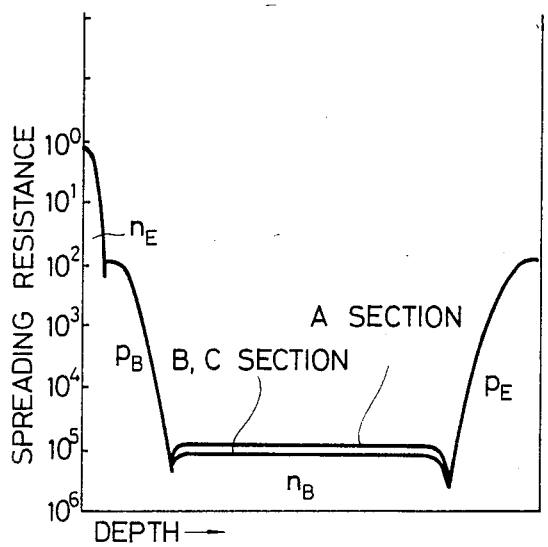
FIG. 4 is an explanatory diagram showing a profile of the spreading resistance in the thyristor in FIG. 3.

When a pulsive overvoltage is applied to the thyristor thus formed, avalanche breakdown occurs in a section (A-A) where the resistance of the second base layer 1 is lowest. This is due to the fact that the specific resistance of the second base layer 1 is varied ±5% because of limitations in the manufacturing process. The thyristor is turned on by the avalanche breakdown occuring in this small region. As the turn-on spreading rate is very small, 0.1 mm/µs, the turn-on current ($i_{BO}$) is concentrated locally to raise the temperature, thus resulting in the damage as described before. The spreading resistance of the semiconductor device in FIG. 3 has a profile as shown in FIG. 4.

Figure 5:
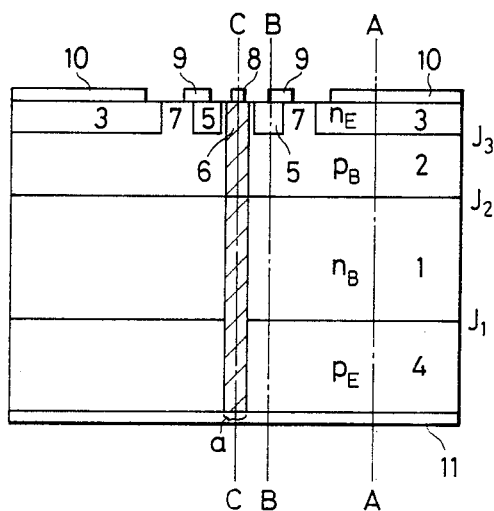
FIG. 5 is a sectional view of an amplification gate type thyristor to which the technical concept of the present invention is applied, showing a first embodiment of the invention.

One embodiment of the present invention is shown in FIGS. 5 through 8. In FIGS. 5 and 3, like parts are designated by like reference numerals or characters. In this embodiment, gold is selectively diffused in the shaded region a between the auxiliary first emitter layers 5 through the layers 2, 1 and 4.

The selective diffusion of gold may be achieved by using a mask of phosphorus glass or oxide film. The description of this method will be omitted, since it is well known in the art. In this embodiment, the thyristor is of a 4,000 V class having a specific resistance ($\rho$) of 260Ω-cm and a thickness of 760 µm. The diffusion temperature of gold diffused into the shaded region a is 820° C., the density is 2.5 to $3.7 \times 10^{13}$/cm$^3$, the spreading resistance in the diffusion region is about $4 \times 10^5 \Omega$. The profile of the spreading resistance is as shown in FIG. 6.

Figure 6:
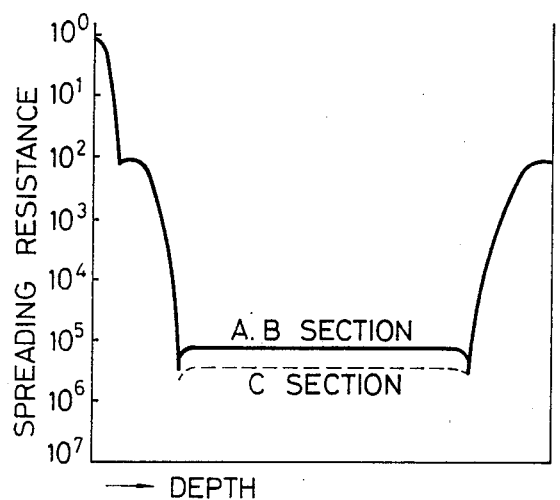
FIG. 6 is an explanatory diagram showing a profile of the spreading resistance in the thyristor in FIG. 5.
Figure 7:
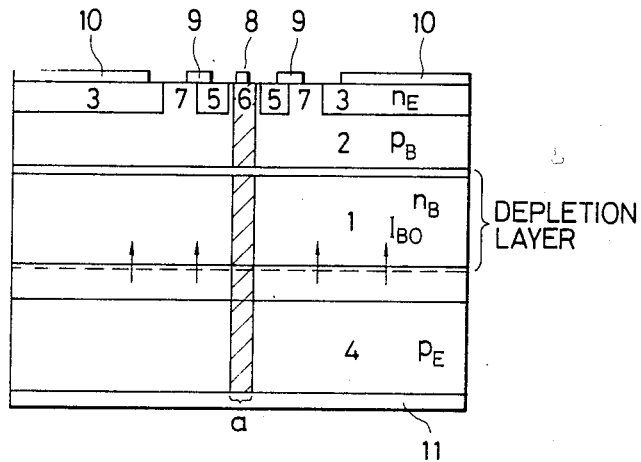
FIGS. 7 and 8 are sectional views showing the states of a depletion layer which are obtained when a DC voltage and a pulsive overvoltage are applied to the thyristor in FIG. 5, respectively.
Figure 8:
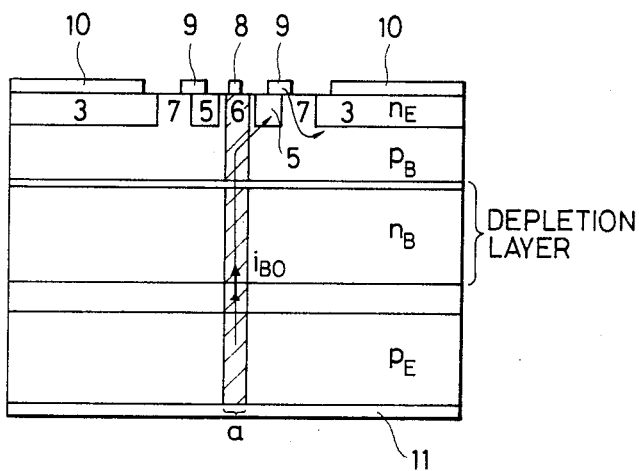

When a DC voltage is applied to the above-described thyristor having the spreading resistance as shown in FIG. 6, the state of the depletion layer is such that the depletion layer width is the same as that which is obtained before the gold diffusion is carried out, as shown in FIG. 7. However, when a pulsive voltage higher than 4,000 V is generated through a circuit and is applied to the thyristor, the depletion layer is extended in the region where the gold diffusion has been carried out, as shown in FIG. 8. If the spreading resistance is of the order of $4 \times 15^5 \Omega$, the depletion layer width is about 760 µm. That is, the depletion layer is extended into the second emitter layer 4; i.e., "punch-through" occurs. The current ($i_{BO}$) flows only in the punch-through region, i.e., the region a whose specific resistance has been increased by the gold diffusion, as a result of which the auxiliary thyristor part is turned on and then the main thyristor part having a long period is turned on. Therefore, local current concentration can be prevented.

Figure 9:
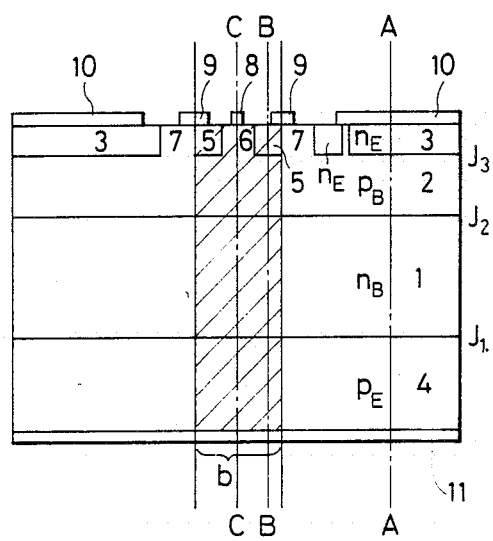
FIG. 9 is a sectional view showing a second embodiment of the invention.
Figure 10:
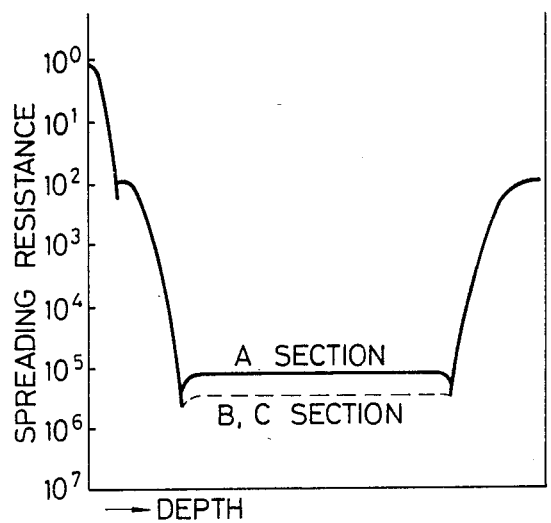
FIG. 10 is an explanatory diagram showing a profile of the spreading resistance in the thyristor in FIG. 9.

In the embodiment shown in FIG. 5, gold is diffused in the shaded region a which includes no auxiliary first emitter layer 5, in order to increase the specific resistance of the second base layer 1. However, if other electrical characteristics such as for instance minimum gate trigger current may be disregarded, then gold may be diffused in the shade region b including the auxiliary first emitter layer 5 as shown in FIG. 9. In this case, the spreading resistance has a profile as shown in FIG. 10. In this embodiment, the same effects can be obtained.

In the above-described embodiments, the technical concept of the invention is applied to the amplification gate thyristor. However, the technical concept of the invention can be applied to an ordinary FI gate type thyristor, because the latter is equivalent to the amplification gate type thyristor when the auxiliary thyristor part is taken into consideration. While the invention has been described with reference to the thyristor, the technical concept of the invention may be applied to a semiconductor element having a control electrode. More specifically, the technical concept of the invention is applicable to the gates of GTO, GATT, etc. with the same effects. It goes without saying that heavy metal impurities such as plantinum instead of gold may be diffused.

As is apparent from the above description, according to the invention, when a pulsive overvoltage is applied, the turn-on region is limited in the auxiliary thyristor part in which heavy metal impurities have been diffused. Therefore, the damage to of a semiconductor device of this type due to the pulsive overvoltage can be prevented.

While the invention has been particularly shown and described with reference to preferred embodiments thereof, it will be understood by those in the art that the foregoing and other changes in form and details may be made therein without departing from the spirit and scope of the invention.

What is claimed is:

1. A semiconductor device having a major surface, a first emitter region of first conductivity type disposed from said major surface into a first base layer of second conductivity type, an auxiliary emitter region of first conductivity type disposed from said major surface into said first base layer, a second base layer of first conductivity type having a first impurity concentration, and a second emitter region of second conductivity type, wherein the first base layer has a gate region extending to the major surface characterized in that a dopant of heavy metal impurities having a concentration higher than said first impurity concentration of said second base layer and above approximately $2.5 \times 10^{13}$/cm$^3$ is selectively diffused in a particular region which is extended from said major surface through said gate region and through the first base layer, the second base layer, and the second emitter region, but not through the first emitter region or auxiliary emitter region, to make the specific resistance of said second base layer inside said particular region higher than the specific resistance of said second base layer outside said particular region.

2. A semiconductor device as set forth in claim 1 wherein said heavy metal is gold.

3. A semiconductor device as set forth in claim 1, wherein said heavy metal is platinum.

* * * * *